United States Patent [19]

Mitsuhashi et al.

[11] 4,405,236
[45] Sep. 20, 1983

[54] SEMICONDUCTOR RING LASER APPARATUS

[75] Inventors: Yoshinobu Mitsuhashi; Junichi Shimada; Kenjiro Sakurai, all of Sakura; Yukinobu Nakamura, Asaka, all of Japan

[73] Assignees: Seiichi Ishizaka; Honda Giken Kogyo Kabushiki Kaisha, both of Tokyo, Japan

[21] Appl. No.: 292,418

[22] Filed: Aug. 13, 1981

[30] Foreign Application Priority Data

Aug. 13, 1980 [JP] Japan ............................ 55-110419

[51] Int. Cl.$^3$ ............................................ G01C 19/64
[52] U.S. Cl. ...................................... 356/350; 372/46; 372/94
[58] Field of Search .................... 356/350; 372/38, 46, 372/94

[56] References Cited

U.S. PATENT DOCUMENTS 3,484,713 12/1969 Fenner ................................. 372/38
3,605,037 9/1971 D'Asaro ............................ 356/350

Primary Examiner—Vincent P. McGraw
Attorney, Agent, or Firm—Armstrong, Nikaido, Marmelstein & Kubovcik

[57] ABSTRACT

A semiconductor ring laser apparatus is provided which comprises a semiconductor laser element having a waveguide region therein and parallel cleavage planes formed between the waveguide region and the medium adjacent thereto. The waveguide region is inclined at a Brewster angle with respect to the normal to the cleavage planes in relation to the medium of the waveguide region and the adjacent medium, and optical means which have a ring-formed optical path are optically coupled to the waveguide region for receiving light therefrom through one of the cleavage planes. These optical means return at least a portion of the light from one of the cleavage planes to the other of the cleavage planes, with the semiconductor laser element and the optical means thereby forming a ring laser oscillator.

7 Claims, 6 Drawing Figures

SEMICONDUCTOR RING LASER APPARATUS

BACKGROUND OF THE INVENTION

1. Field of the Invention

This invention relates to a semiconductor ring laser apparatus which comprises a semiconductor laser element and a ring-formed resonator having a ring-formed optical path provided outside the element so as to form a ring laser oscillator.

2. Description of the Prior Art

A semiconductor laser element, as compared with a gas laser or the like, has the advantages of very small size, light weight, low consumption of electric power, high efficiency, low cost, as well as other advantages. Accordingly, the semiconductor laser element has recently begun to be used for optical communication, a laser printer, a video disc and others.

However, in the field of a ring laser gyroscope apparatus serving as an angular speed detector used in an inertial navigation apparatus for an aircraft or the like, a helium neon laser has held an unrivalled position and a semiconductor laser element has not heretofore been used. The reason is that a conventional semiconductor laser element is of the type that a waveguide in the crystal structure thereof is provided which makes a right angle to a cleavage plane of the crystal structure so that the cleavage plane serves as a mirror, and the wave guide extending between the front and rear parallel cleavage planes is formed to become a Fabry-Perot type optical resonator to effect laser oscillation. Consequently, even when a ring-formed optical path is provided outside that element, a ring-formed oscillator cannot be made and thus highly sensitive angular speed detection cannot be obtained.

SUMMARY OF THE INVENTION

This invention has for its object to provide a semiconductor ring laser apparatus which has the advantages of small size, light weight, low consumption of electric power, high efficiency, low cost and others in comparison to a gas ring laser apparatus and which is suitable for use in a ring laser gyroscope apparatus.

A waveguide of a semiconductor laser element in the present invention is so provided that the inclined angle thereof with respect to a normal to a cleavage plane of the element makes a Brewster angle in relation to the waveguide medium and a medium which is adjacent to the cleavage plane, and a ring-formed optical path including an optical system comprising a lens, a mirror, etc., is provided outside the semiconductor laser element to form a ring-formed resonator.

The present invention utilizes the principle of a Brewster angle that, as shown in FIG. 1 in a case where a ray is incident from a medium I (refractive index=$n_1$) onto a medium II of a different refractive index (refractive index=$n_2$), if an incident angle $\theta_i$ and a transmission angle $\theta_t$ satisfy the condition of $\theta_i + \theta_t = 90$ degrees, the incident angle $\theta_i$ is called "Brewster angle", and $\tan \theta_i = n_2/n_1$ is established. In this condition, the linear polarized wave, of which an electric field vector is in parallel to the plane of incidence, becomes completely non-reflected. Thus, according to the present invention and applying this principle, a waveguide of a semiconductor laser element has an inclined angle with respect to a normal cleavage plane of the element, and it makes a Brewster angle in relation to the waveguide medium and a medium which is adjacent to the cleavage plane. Thus, a linear polarized wave of an electric field vector is parallel to the p-n junction plane and is, therefore, not reflected at all on the cleavage plane. Additionally, according to this invention, a ring-formed optical path is provided outside the element so as to effect a ring laser oscillator.

DETAILED DESCRIPTION OF THE PREFERRED EMBODIMENTS

Figure 2:
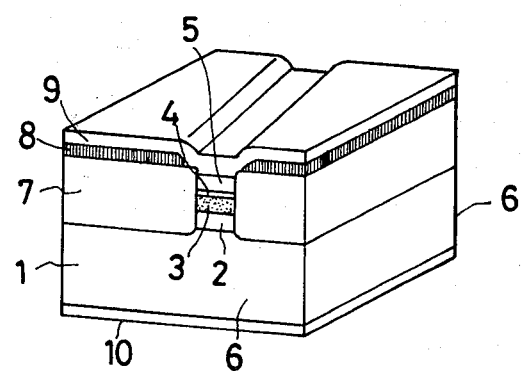
FIG. 2 is a perspective schematic diagram of a semiconductor laser element according to the present invention.

FIG. 2 shows one example of a semiconductor laser element according to the present inveniton. Numeral 1 denotes an n-Ga As substrate, numeral 2 denotes an n-$Al_{x_2} Ga_{1-x_2}$ As clad layer, numeral 3 denotes an n-$Al_{x_g} Ga_{1-x_g}$ As waveguide region, numeral 4 denotes an $Al_{x_1} Ga_{1-x_1}$ As active layer and numeral 5 denotes a p-$Al_{x'_2} Ga_{1-x'_2}$ As clad layer. These layers 2, 3, 4 and 5 form a striped mesa portion formed to have a Brewster angle $\theta_B$ in its relation to a normal to each cleavage plane 6. Numeral 7 denotes an n-$Al_{x_3} Ga_{1-2c}$ As burying layer, numeral 8 denotes a $SiO_2$ insulating layer covering the upper area other than the foregoing striped mesa portion, numeral 9 denotes a Cr-Au metallic film electrode which is in direct contact with the clad layer 5 of the striped mesa portion and covers the oxide insulation layer 8, and numeral 10 denotes an AuGeNi-Au metallic film electrode.

This element is manufactured by a process in which the clad layer 2, the waveguide region 3, the active layer 4 and the clad layer 5 are grown in sequence on the substrate 1 by a conventional sequential liquid phase epitaxial growth method, and then the striped mesa portion of 2, 3, 4 and 5 is formed by mesa etching. By again using a liquid phase epitaxial growth method, the burying layer 7 is grown on the upper surface of the substrate 1 and on the side surfaces of the mesa portion, and then $SiO_2$ is deposited to cover the upper surface of the burying layer 7, except for the upper surface of the striped mesa portion. Thereafter, thermal diffusion of Zn is performed through a window in the layer of $SiO_2$ to form the $SiO_2$ insulation layer 8. Finally, the metallic layers of electrodes 9 and 10 are formed on the upper and lower surfaces thereof by evaporation deposition treatment. This technique is described in K. Saito and R. Ito, "Buried-Heterostructure AlGaAs Lasers", IEEE Journal of Quantum Electronics, Vol. 16, pp. 205-215, February, 1980.

If, as described above, at the time of forming the waveguide region 3, the waveguide region is set to form a Brewster angle with respect to the normal to the cleavage plane 6, a semiconductor laser element which has no reflection at the cleavage plane 6 of the element can be easily manufactured by the abovedescribed conventional process.

Figure 1:
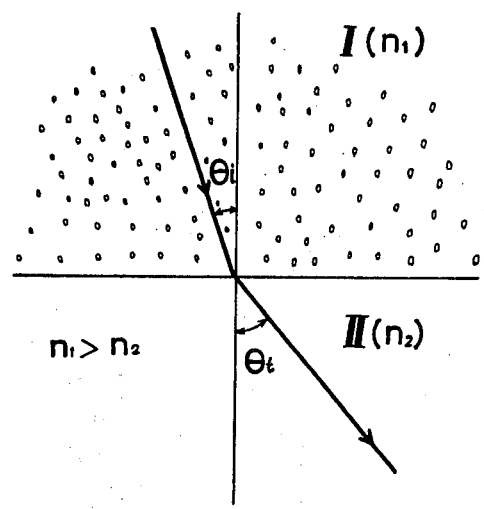
FIG. 1 is a diagram explaining the principle of a Brewster angle.
Figure 3:
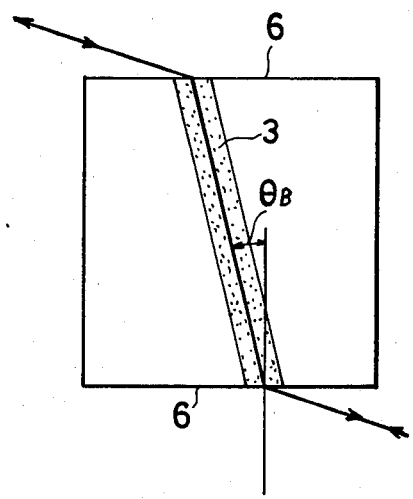
FIG. 3 is a top plan view, partly omitted, of a semiconductor laser element of FIG. 2.

FIG. 3 is a schematic view showing a model of the semiconductor laser element of FIG. 2 viewed from above and, in this view, the p-n junction plane of the waveguide 3 is a plane parallel to the drawing sheet surface.

One specific example of the Brewster angle $\theta_B$ is described as follows: When the refractive index of the waveguide of a AlGaAs laser element is about 3.5 and the refractive index of the surrounding gaseous body is about 1.0, $$\theta_B \simeq \tan^{-1} 1.0/3.5 \simeq 16°$$

Figure 4:
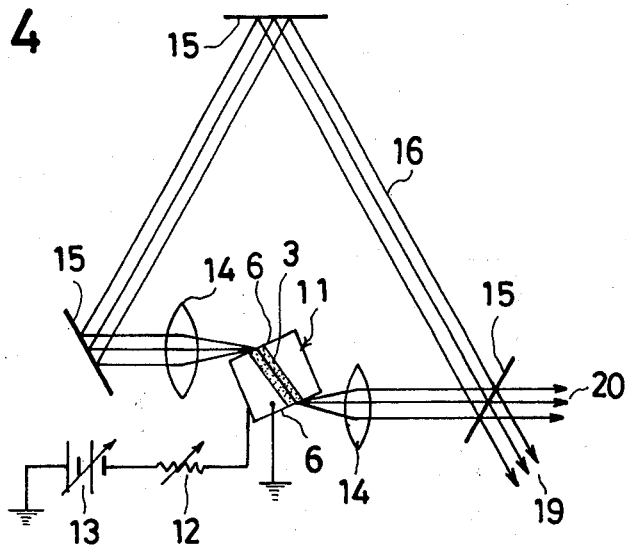
FIG. 4 is a schematical view of a first embodiment of a conductor ring laser apparatus of the present invention.

FIG. 4 shows one embodying example of this invention. A foregoing type semiconductor laser element 11 has a cleavage plane 6 which has no reflection plane, and the element 11 is connected at its upper and lower electrodes to a driving electric source 13 through a resistance 12. A lens 14, a mirror 15 and a beam splitter 15A are part of a ring-formed resonator having a ring-formed optical path. A clockwise beam 19 and a counterclockwise beam 20 are taken out from the beam splitter 15A.

When this embodying example is applied to a ring laser type gyroscope apparatus, the same is so arranged that the clockwise beam 19 and the counterclockwise beam 20, which are passed through the beam splitter 15A, may be added together by using a prism, a mirror or the like (not shown) and the frequency difference between the two beams is detected by an optical detector (not shown) as a beat signal of a change in optical output.

If, in FIG. 4, one or more of the two mirrors 15,15 and the single beam splitter 15A is replaced by a diffraction grating, the further advantageous effect of an improved single frequency selection property and a polarization plane linear property can be obtained.

Figure 5:
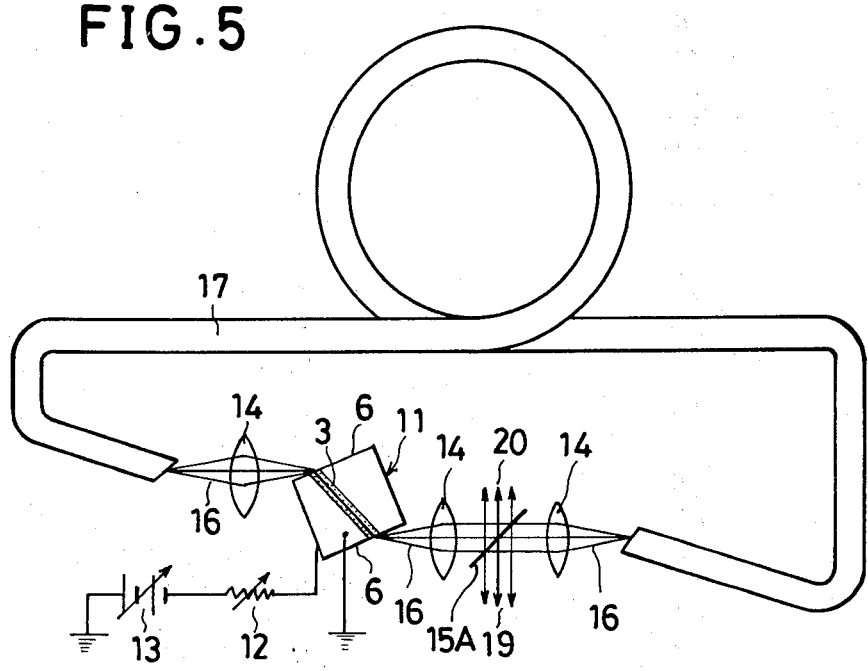
FIG. 5 is a schematic view of a second embodiment of a semiconductor ring laser apparatus of the present invention.

FIG. 5 shows another embodiment of the present invention. This is of the type in which the ring-formed optical path is constructed by an optical fiber member 17 in place of the mirrors 15 in FIG. 4.

In any of the embodiments in FIGS. 4 and 5, the medium which is to be adjacent to the cleavage plane 6 is a gaseous body such as air or the like. When an oil-impregnated lens or the like is used instead of the lens 5, such a medium as oil, optical cement or the like is charged into the space between the semiconductor laser element and the lens and, in this case, the inclined angle of the waveguide of the semiconductor laser element must be set to have a Brewster angle corresponding to that medium.

Figure 6:
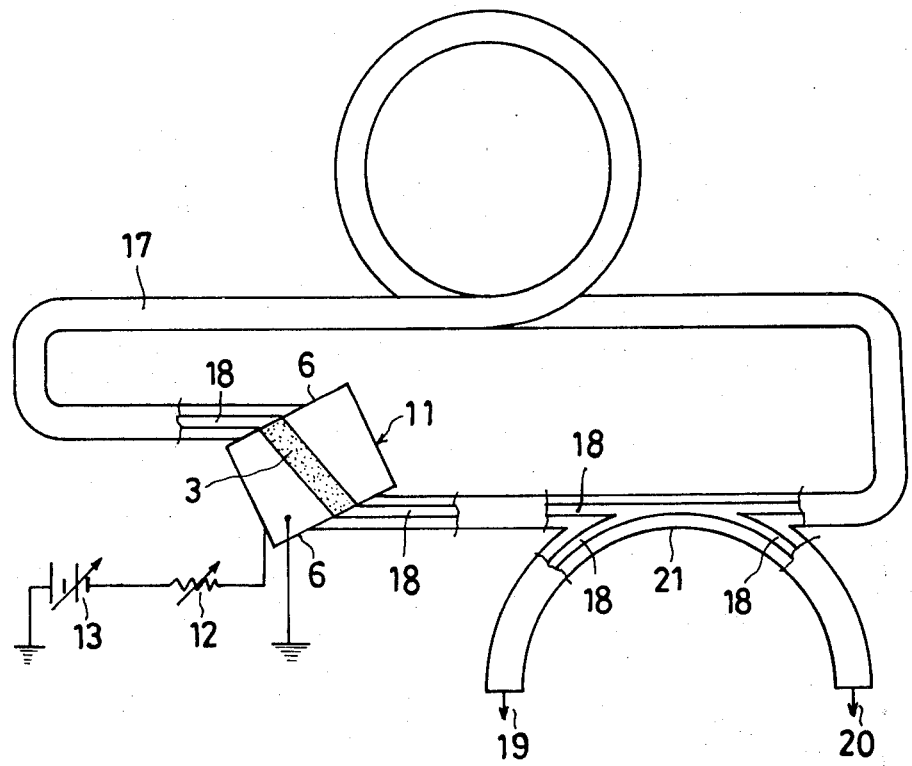
FIG. 6 is a schematic view of a third embodiment of a semiconductor ring laser apparatus of the present invention.

FIG. 6 shows another embodiment of the present invention wherein the semiconductor laser element 11 and the optical fiber member 17 are directly connected to one another without using an optical system such as lens or the like. In this example, the waveguide 3 of the semiconductor laser element 11 is set so that the inclined angle thereof with respect to the normal to the cleavage plane 6 is at a Brewster angle $\theta_B$ with respect to the element medium and a core 18 of the optical fiber member 17. In the core 18 of the optical fiber member 17, each end surface is cut to have the foregoing angle and polished and is directly connected to the waveguide 3. Thus, the polarized wave which is in parallel with the p-n junction plane becomes completely non-reflecting at the connecting surface.

If the refractive index of the waveguide 3 of the semiconductor laser element 11 is about 3.5 and the refractive index of the optical fiber 17 is about 1.5, the Brewster angle $\theta_B$ in this case becomes as follows:

$$\theta_B \simeq \tan^{-1} 1.5/3.5 \simeq 23.2°$$

The semiconductor laser element in this example can be easily manufactured in a similar manner as above.

The ring-formed optical path having the optical fiber member 17 outside the semiconductor laser element 11 is a ring-formed resonator for effecting ring laser oscillation, and the same is so arranged that a clockwise beam 19 and a counterclockwise beam 20 are taken out from both ends of a diverged portion 21 of the optical fiber member 17.

When either of the embodiments of FIGS. 5 and 6 is used for a ring laser gyroscope apparatus, the same is so arranged, similarly to the embodiment shown in FIG. 4, and the clockwise beam 19 and the counterclockwise beam 20 may be added together by using a mirror, a prism or the like (not shown) so that a frequency difference between the two beams is detected by an optical detector (not shown) as a beat signal of a change in optical output.

Thus, according to this invention, the waveguide region of the semiconductor laser element is so provided that the inclined angle thereof with respect to the normal to the cleavage plane of the element may form a Brewster angle in relation to a waveguide medium as a medium which is adjacent to the cleavage plane, and a ring-formed path is provided by an optical system outside the semiconductor laser element so as to be served a ring-formed resonator. Thus there can be obtained a practical, excellent semiconductor ring laser apparatus which has the advantages of small size, light weight, low consumption of electric power, high efficiency, low costs and others as compared with a gas ring laser apparatus and is suitable for use, for instance, in a ring laser gyroscope apparatus or the like.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims rather than the foregoing description, and all changes which come within the meaning and range of equivalency of the claims are, therefore, to be embraced therein.

What is claimed:

1. A semiconductor ring laser apparatus comprising a semiconductor laser element having a waveguide region therein and parallel cleavage planes formed between said waveguide region and medium adjacent thereto, wherein the waveguide region is inclined at a Brewster angle with respect to the normal to the cleavage planes in relation to the medium of the waveguide region and said adjacent medium, and optical means having a ring-formed optical path optically coupled to said waveguide region for receiving light therefrom through one of said cleavage planes and returning at least a portion of the light therefrom to the other of the cleavage planes, said semiconductor laser element and said optical means thereby forming a ring laser oscillator.

2. A semiconductor ring laser apparatus as set forth in claim 1 wherein said optical means includes separating means for separating a portion of the light in said optical means into two oppositely oriented components.

3. A semiconductor ring laser apparatus as set forth in claim 2 wherein said separating means comprises a beam splitter.

4. A semiconductor ring laser apparatus as set forth in any one of claims 1-3 wherein said optical means comprises lens means in said adjacent medium for focusing the light emitted by said semiconductor laser element and a plurality of mirrors for reflecting said focused light along said ring path.

5. A semiconductor ring laser apparatus as set forth in any one of claims 1-3 wherein said optical means includes an optical fiber.

6. A semiconductor ring laser apparatus as set forth in claim 5 wherein said optical fiber contacts said waveguide regions of said semiconductor laser element along the cleavage planes thereof and is thereby said adjacent medium.

7. A semiconductor ring laser apparatus as set forth in claim 5 wherein said separating means comprises a diverged portion of said optical fiber.

* * * * *